United States Patent [19]

Maki et al.

[11] Patent Number: 5,965,036
[45] Date of Patent: Oct. 12, 1999

[54] MICROETCHING COMPOSITION FOR COPPER OR COPPER ALLOY

[75] Inventors: Yoshiro Maki; Toshiko Nakagawa; Yasushi Yamada; Takashi Haruta; Maki Arimura, all of Amagasaki, Japan

[73] Assignee: MEC Co., Ltd., Amagasaki, Japan

[21] Appl. No.: 08/789,206

[22] Filed: Jan. 24, 1997

[51] Int. Cl.$^6$ .................................................. C09K 13/00
[52] U.S. Cl. ........................ 216/106; 216/105; 252/79.2; 252/79.4
[58] Field of Search ................................ 252/79.1, 79.2, 252/79.4; 216/105, 106

[56] References Cited

U.S. PATENT DOCUMENTS

| | | | |
|---|---|---|---|
| 4,695,348 | 9/1987 | Battey et al. | 156/647 |
| 5,512,201 | 4/1996 | Singh et al. | 252/142 |
| 5,532,094 | 7/1996 | Arimura et al. | 252/79.1 |

FOREIGN PATENT DOCUMENTS

| | | |
|---|---|---|
| 1908421 | 9/1970 | Germany . |
| 63-079983 | 4/1988 | Japan . |
| 06077095 | 3/1994 | Japan . |

OTHER PUBLICATIONS

Patent Abstracts of Japan, vol. 018, No. 324, (E–1564), Jun. 20, 1994, JP 06 077095, Mar. 18, 1994 Endo.

Patent Abstracts of Japan, vol. 012, No. 306, (C–522), Aug. 19, 1988, JP 63 079983, Apr. 9, 1988 Hayashi et al.

*Primary Examiner*—Benjamin Utech
*Assistant Examiner*—George Goudreau
*Attorney, Agent, or Firm*—Oblon, Spivak, McClelland, Maier & Neustadt, P.C.

[57] ABSTRACT

A microetching composition for copper or copper alloys comprising, (a) an oxidizing agent which can oxidize the copper or copper alloy, (b) a polymer compound which contains polyamine chains or a cationic group or both in the amount of 0.000001 to 1.0% by weight, and (c) water. The composition can produce surfaces of copper or copper alloy exhibiting excellent adhesion to resins such as prepregs and resists, and superior solderability. The composition can be adaptable to the manufacture of printed wiring boards with highly integrated fine line patterns.

15 Claims, No Drawings

MICROETCHING COMPOSITION FOR COPPER OR COPPER ALLOY

BACKGROUND OF THE INVENTION

1. Field of the Invention

The present invention relates to a microetching composition useful for treating surfaces of copper or copper alloys.

2. Description of the Background Art

In the manufacture of printed-wiring boards, copper surfaces are polished prior to coating such surfaces with an etching resist or a solder resist to improve adhesion of these resists to the copper surfaces. Mechanical cleaning using a buffing or scrubbing machine, or chemical cleaning, known as microetching, are used for roughening the copper surfaces. Microetching is more popular for treating substrates with fine line patterns. The copper surface is etched as deeply as 1–5 μm by the microetching treatment. This depth of etching is calculated from the weight of copper decreased by etching, the specific gravity, and the surface area of the copper.

A microetching agent used for the microetching process which contains a cationic surfactant such as a quaternary ammonium salt is disclosed in U.S. Pat. No. 4,956,035. The specification of this USP states that the microetching agent can smooth the surface of a metal and improve adhesion of an etching resist to the surface.

However, the smooth surface treated with the microetching agent does not exhibit adequate adhesion with a prepreg, or a curable ink in which a hard (highly cross-linked) resin is used. The adhered portion may peel or produce swelling, which may permit chemical solutions to invade the space between the metal surface and the resin in the subsequent chemical treatment steps.

The inventors of the present invention have undertaken extensive studies and found that a microetching agent comprising a small amount of a polymer compound which contains polyamine chains or a cationic group, or both, can produce a deep irregularly etched surface on the surface of copper or a copper alloy. This surface differs from the surface obtained by treatment with the above-described microetching agent disclosed by U.S. Pat. No. 4,956,035 and exhibits excellent adhesion to a solder resist and the like.

SUMMARY OF THE INVENTION

Accordingly, an object of the present invention is to provide a microetching composition for copper or copper alloys comprising, (a) an oxidizing agent which can oxidize the copper or copper alloy, (b) a polymer compound which contains polyamine chains or a cationic group, or both (hereinafter referred to as a cationic polymer compound), in the amount of 0.000001 to 1.0% by weight, and (c) water.

In a preferred embodiment of the present invention the oxidizing agent comprises a cupric ion source.

In another preferred embodiment of the present invention the oxidizing agent comprises a ferric ion source.

Other objects, features and advantages of the invention will hereinafter become more readily apparent from the following description.

DETAILED DESCRIPTION OF THE INVENTION AND PREFERRED EMBODIMENTS

The cationic polymer compound used in the present invention is a polymer with a molecular weight of at least 1000, preferably from several thousands to several millions, and exhibiting a cationic behavior when dissolved in water. Given as specific examples of such a cationic polymer compound are polyethylene imines, alkoxylates of polyethylene imine, polyalkylene polyamines, quaternary ammonium salt-type styrene polymers, quaternary ammonium salt-type aminoalkyl (meth)acrylate polymers, quaternary ammonium salt-type polymers of diallylamine, quaternary ammonium salt-type copolymers of diallylamine and acrylamide, polymers of a salt of aminoalkyl acrylamide, and cationic cellulose derivatives. The salt as used herein includes, for example, chloride, sulfate, phosphate, and salts of various organic acids. Polyethylene imines and polyalkylene polyamines are particularly preferred cationic polymer compounds. These cationic polymer compounds may be used either individually or in combinations or two or more. Commercially available products which are supplied as components for antistatic agents used for resins or fibers, polymer flocculants used in waste water treatments, or hair rise-conditioning agents, can also be used as the cationic polymer compound.

The cationic polymer compound may be used in the microetching agent of the present invention in the amount of 0.000001 to 1.0% by weight, preferably 0.00001 to 0.5% by weight. The specific amount is selected from these ranges according to the type of polymer compound, the pH of the microetching agent solution, and the like. If this amount is less than 0.000001% by weight, the effect is insufficient and adequate deep irregularities cannot be produced on the metal surfaces; if more than 1.0% by weight, the composition exhibits a rust preventive action, producing smooth etched surfaces.

There are no specific limitations to the components for the microetching agent in which the cationic polymer compound is incorporated provided that the agent contains an oxidizing agent capable of microetching (chemically polishing) the surfaces of the copper or copper alloy by oxidation. One preferred embodiment of such a microetching agent is an aqueous solution which contains a cupric ion source compound as the oxidizing agent, an organic or inorganic acid, and a halide ion source.

Given as examples of the cupric ion source compounds are a cupric salt of an organic acid, cupric chloride, cupric bromide, and cupric hydroxide. Two or more cupric ion source compounds may be used together. The content of the cupric ion source compounds in the composition of the present invention in terms of the amount of metallic copper is 0.01 to 20% by weight. Etching is slow if this amount is too small. If the amount is too great, it is difficult to dissolve the cupric ion source compounds in the solution, resulting in the production of smudges on the treated copper surface, although these smudges produced on the treated copper surface may be removed by treating with an aqueous solution of an acid or an alkali.

Examples of the organic acid used in this microetching agent include saturated aliphatic acids, such as formic acid, acetic acid, propionic acid, butyric acid, valeric acid, and caproic acid; unsaturated aliphatic acids, such as acrylic acid, crotonic acid, and iso-crotonic acid; saturated aliphatic dicarboxylic acids, such as oxalic acid, malonic acid, succinic acid, glutaric acid, adipic acid, and pimelic acid; unsaturated aliphatic dicarboxylic acids such as maleic acid; aromatic carboxylic acids, such as benzoic acid, phthalic acid, and cinnamic acid; hydroxyl carboxylic acids, such as glycolic acid, lactic acid, malic acid, and citric acid; carboxylic acids with substituents, such as sulfamic acid, β-chloropropionic acid, nicotinic acid, ascorbic acid, hydroxyl pivalic acid, and levulinic acid; as well as their derivatives. As examples of the inorganic acids, hydrochloric acid, sulfuric acid, nitric acid, and phosphoric acid are given. Two or more these organic or inorganic acids may be used together.

The amount of the organic acids or inorganic acids is preferably in the range of 0.1–30%. If this amount is too small, the composition cannot sufficiently dissolve copper oxide and may produce smudges on the treated surfaces. In addition, it is difficult to achieve a stable etching speed. If the amount of the organic acids or inorganic acids is too great, the solution stability of the copper is lowered. Re-oxidation may occur on the surface of the copper.

Halide ions used in this preferred embodiment include chloride ion, bromide ion, and the like. The halide ions are added as a compound which can be dissociated into a halide ion in solution, such as hydrochloric acid, hydrobromic acid, sodium chloride, calcium chloride, potassium chloride, ammonium chloride, potassium bromide, copper chloride, zinc chloride, iron chloride, iron bromide, tin bromide, and copper bromide. Two or more halide ion source compounds may be used. Cupric chloride, for example, can be used as a compound functioning as both the cupric ion source compound and the halide ion source compound.

The amount of halide ion in the composition of this embodiment is preferably in the range of 0.01–20%. If too small, it is difficult to obtain copper surfaces with excellent adhesion of resins and superior solderability. Too large an amount of halide ion may destabilize the solubility of copper in the solution.

In addition to the above essential components, the microetching composition of this embodiment may be formulated with additives, such as an organic acid salt of sodium, potassium, or ammonium to reduce fluctuation in the pH during the etching treatment; a complexing agent such as ethylenediamine, pyridine, aniline, ammonia, monoethanolamine, diethanolamine, triethanolamine, and N-methyldiethanol-amine to improve the solution stability of copper; and various other additives.

Another preferred embodiment of the microetching agent of the present invention is an aqueous solution which contains a ferric ion source compound as the oxidizing agent, an organic or inorganic acid, and a halide ion source.

Given as examples of the ferric ion source compounds are iron (III) chloride, iron (III) bromide, iron (III) iodide, iron (III) sulfate, iron (III) nitrate, andiron (III) acetate. Two or more ferric ion source compounds may be used together. The content of the ferric ion source compounds in the composition of this embodiment in terms of the amount of metallic iron is 0.01 to 20% by weight. The etching is slow if this amount is too small. If the amount is too great, it is difficult to dissolve the cupric ion source compounds in the solution, resulting in the production of smudges on the treated copper surface.

Examples of the organic acid used in this microetching agent include saturated aliphatic acids, such as formic acid, acetic acid, propionic acid, butyric acid, valeric acid, and caproic acid; unsaturated aliphatic acids, such as acrylic acid, crotonic acid, and iso-crotonic acid; saturated aliphatic dicarboxylic acids, such as oxalic acid, malonic acid, succinic acid, glutaric acid, adipic acid, and pimelic acid; unsaturated aliphatic dicarboxylic acids such as maleic acid; aromatic carboxylic acids, such as benzoic acid, phthalic acid, and cinnamic acid; hydroxyl carboxylic acids, such as glycolic acid, lactic acid, malic acid, and citric acid; carboxylic acids with substituents, such as sulfamic acid, β-chloropropionic acid, nicotinic acid, ascorbic acid, hydroxyl pivalic acid, and levulinic acid; as well as their derivatives. As examples of the inorganic acids, hydrochloric acid, sulfuric acid, nitric acid, and phosphoric acid are given. Two or more these organic or inorganic acids may be used together.

The amount of the organic acids or inorganic acids is preferably in the range of 0.1–30%. If this amount is too small, the composition cannot sufficiently dissolve copper oxide and may produce smudges on the treated surfaces. In addition, it is difficult to achieve a stable etching speed. If the amount of the organic acids or inorganic acids is too great, the solution stability of the copper is lowered. Re-oxidation may occur on the surface of the copper.

Halide ions used in this preferred embodiment include chloride ion, bromide ion, and the like. The halide ions are added as a compound which can be dissociated into a halide ion in solution, such as hydrochloric acid, hydrobromic acid, sodium chloride, calcium chloride, potassium chloride, ammonium chloride, potassium bromide, copper chloride, zinc chloride, iron chloride, tin bromide, and copper bromide. Two or more halide ion source compounds may be used. Iron (III) chloride, for example, can be used as a compound functioning as both the ferric ion source compound and the halide ion source compound.

The amount of halide ion in the composition of this embodiment is preferably in the range of 0.01–20%. If too small, it is difficult to obtain copper surfaces with excellent adhesion to resins and superior solderability. If the amount of the halide ion is too large, not only is it difficult to produce a copper surface with excellent adhesive properties and solderability, but also the solubility of copper in the solution is unstable.

In the same way as in the above-described preferred embodiment containing a cupric ion as the oxidizing agent, this microetching composition containing ferric ion compound may also be formulated with various additives mentioned above.

The microetching agent composition of the present invention can be prepared by adding the above-mentioned components in the proportions described above to water (d) and blending the mixture. There are no specific limitations to the method of addition. The components may be added either all at one time or separately in any arbitrary order. The water used is preferably ion exchanged water.

There are no specific limitations to the method for using the surface treating composition of the present invention. Examples of such a method include a method of spraying the composition onto the surfaces of copper or copper alloy to be treated, a method of immersing the copper or copper alloy in the composition, and the like. If necessary, air may be bubbled into the composition to oxidize cuprous ion or ferrous ion which has been formed therein by etching of the copper or copper alloy to cupric ion or ferric ion, whereby the etching capability of the aqueous solution is restored.

In order to further improve the adhesion between the copper or copper alloy surface and a resin, it is possible to further treat the surfaces treated with the microetching composition of the present invention with an aqueous solution of an azole compound or an alcoholic solution according, for example, to U.S. Pat. No. 3,645,772. In addition, the surfaces may be coated with a coupling agent, such as a titanium coupling agent, zirconium coupling agent, aluminum coupling agent, or silane coupling agent. An oxidizing treatment called brown oxide or black oxide treatment may be applied after the microetching of the present invention.

The microetching composition of the present invention can be widely used for chemical cleaning or the like of copper or copper alloys. The resulting surfaces of the copper or copper alloy have adequate irregularities with deep convex and concave portions so that they can exhibit not only excellent adhesion to resins, such as prepregs, solder resists, dry film resists, and electrodeposition resists, but also superior solderability. Because of this, the microetching composition is particularly useful for the manufacture of various printed-wiring boards, including those for semiconductor packages, such as pin grid array (PGA) packages or ball grid array (BGA) packages, as well as for the surface treatment of lead frames used for integrated circuit boards. Furthermore, because the composition of the present invention exhibits strong adhesion with metals, the composition can be used for pretreatment for plating of substrates which are covered with a metal.

For example, in the manufacture of copper-clad laminates for printed-wiring boards, surfaces exhibiting excellent adhesion to prepregs and superior etching performance in the patterning operation can be produced by roughening copper foils using the microetching composition of the present invention. Further, in the manufacture of multi-layered printed-wiring boards, the use of the microetching composition for roughening copper surfaces of inner layers produces surfaces which exhibit not only excellent adhesion to prepregs, but also a superb effect in preventing formation of pink rings. In addition, the microetching composition can improve the adhesion strength of a copper surface and an insulating resin, if used for roughening the copper surface for manufacturing printed-wiring boards by the build-up method. Because the surfaces treated with the microetching composition of the present invention are less glossy than the surfaces treated with conventional sulfuric acid-hydrogen peroxide-type etchants, the composition has the effect of reducing diffusion of light during irradiation, thereby increasing the resolution of photosensitive resins when the photosensitive resins are coated or laminated, in addition to the effect of increased adhesion to resins.

The surfaces obtained by the microetching composition of the present invention also exhibit excellent metal surface wettability. The composition is thus effective for treating surfaces of printed-wiring boards before the hot air solder leveling step or before mounting electronic parts.

Other features of the invention will become apparent in the course of the following description of the exemplary embodiments which are given for illustration of the invention and are not intended to be limiting thereof.

EXAMPLES

Examples 1–5

Microetching solutions of the present invention were prepared by mixing the components listed in Table 1. The microetching solution obtained was sprayed on the surface of a copper foil with a thickness of 70 μm at 40° C. for 60 seconds. The etched copper foil thus obtained was laminated to two prepregs (GEPL-170™, manufactured by Mitsubishi Gas Chemical Co., Ltd.) for multi-layered wiring boards with a thickness of 0.15 mm each. Next, the adhesion between the copper foil and the wiring boards was evaluated by measuring the peel strength according to JIS C6481 (1990). The results are shown in Table 1.

Comparative Examples 1–3

Microetching solutions shown in Table 1 were prepared and evaluated in the same manner as in Examples 1–4. The results are shown in Table 1.

TABLE 1

| | Component | % | Peel strength (kgf/cm) |
|---|---|---|---|
| Example 1 | Cupric acetate | 5 | |
| | Acetic acid | 7 | |
| | Ammonium chloride | 4 | 1.5 |
| | Epomine P-1000 ™ *1 | 0.0005 | |
| | Ion-exchanged water | Balance | |
| Example 2 | Ferric chloride•2H$_2$O | 1 | |
| | Formic acid | 5 | 1.5 |
| | Epomine SP-200 ™ *2 | 0.0002 | |
| | Ion-exchanged water | Balance | |
| Example 3 | Ferric chloride•2H$_2$O | 2 | |
| | Malic acid | 5 | 1.4 |
| | Sunflock 700 ™ *3 | 0.0002 | |
| | Ion-exchanged water | Balance | |
| Example 4 | Cupric bromide | 2 | |
| | Acetic acid | 6 | 1.3 |
| | Consens CP-104 ™ *4 | 0.0001 | |
| | Ion-exchanged water | Balance | |
| Example 5 | Cupric chloride•2H$_2$O | 4 | |
| | Hydrochloric acid | 2 | 1.1 |
| | Lugaluan G 15000 ™ *5 | 0.002 | |
| | Ion-exchanged water | Balance | |
| Comparative Example 1 | Ferric chloride•2H$_2$O | 1 | |
| | Hydrogen peroxide | 5 | 0.6 |
| | Ion-exchanged water | Balance | |
| Comparative Example 2 | Sulfuric acid | 10 | |
| | Hydrogen peroxide | 5 | 0.4 |
| | Ion-exchanged water | Balance | |
| Comparative Example 3 | Cupric chloride | 4 | |
| | Formic acid | 6 | 0.5 |
| | Consens CP-104 ™ *4 | 5 | |
| | Ion-exchanged water | Balance | |

*1 Polyethylene imine with MW 70,000 manufactured by Nippon Shokubai Co., Ltd.
*2 Polyethylene imine with MW 10,000 manufactured by Nippon Shokubai Co., Ltd.
*3 Cationic polymer flocculant manufactured by Sanyo Chemical Co., Ltd.
*4 Polymer of quaternary ammonium salt-type diallyl amine with MW 200,000, manufactured by Senka Co., Ltd.
*5 Polyethylene imine methoxylate manufactured by BASF Japan Co., Ltd.

As illustrated above, the microetching composition of the present invention can produce surfaces of copper or copper alloy exhibiting excellent adhesion to resins such as prepregs and resists, and superior solderability. Because the resulting surface is less glossy than the surface obtained by conventional microetching, such a surface can improve resolution in development when used as a substrate for a photosensitive resin and can reduce errors by an automatic optical inspector (AOI) when the circuit in the printed wiring board is inspected using the AOI. The microetching composition of the present invention therefore can be adaptable to the manufacture of printed wiring boards with highly integrated fine line patterns.

Obviously, numerous modifications and variations of the present invention are possible in light of the above teachings. It is therefore to be understood that, within the scope of the appended claims, the invention may be practiced otherwise than as specifically described herein.

What is claimed is:

1. A microetching composition for copper or copper alloys comprising:
  (a) an oxidizing agent which can oxidize the copper or copper alloy and is selected from cupric ion source compounds,
  (b) an organic acid or an inorganic acid,
  (c) a halide ion source compound,
  (d) a polymer compound having a molecular weight of at least 1,000 which contains polyamine or polyimine chains or a cationic group or both in the amount of 0.000001 to 1.0% by weight, and (e) water.

2. The microetching composition according to claim 1, wherein said cupric ion source compound is cupric chloride.

3. The microetching composition according to claim 1, wherein said polymer compound which contains polyamine or polyimine chains or a cationic group, or both is selected from the group consisting of polyethylene imines, alkoxylate of polyethylene imine, polyalkylene polyamines, quaternary ammonium salt-type styrene polymers, quaternary ammonium salt-type aminoalkyl (meth)acrylate polymers, quaternary ammonium salt-type polymers of diallylamine, quaternary ammonium salt-type copolymers of diallylamine and acrylamide, polymers of a salt of aminoalkyl acrylamide, and cationic cellulose derivatives.

4. The microetching composition according to claim 1, wherein the polymer compound is used in an amount of from 0.00001 to 0.5% by wt.

5. The microetching composition according to claim 1, wherein the content of the cupric ion source compound in terms of the amount of metallic copper is 0.01 to 20% by wt.

6. The microetching composition according to claim 1, wherein the cupric ion source compound is selected from the group consisting of cupric chloride, cupric bromide, cupric hydroxide and cupric salts of organic acids.

7. The microetching composition of claim 1, wherein the acid is selected from the group consisting of acetic, formic, malic and hydrochloric.

8. The microetching composition of claim 1, wherein the amount of organic or inorganic acid is in the range of 0.1 to 30% by wt.

9. The microetching composition of claim 1, wherein the amount of halide ion is in the range of 0.01 to 20% by wt.

10. The microetching composition of claim 2, wherein the amount of organic or inorganic acid is in the range of 0.1 to 30% by wt.

11. The microetching composition of claim 2, wherein the amount of halide ion is in the range of 0.01 to 20% by wt.

12. The microetching composition of claim 1, which also includes an additive to reduce fluctuation in the pH during etching or an additive to improve the solution stability of copper or both.

13. A method of treating the surface of copper or a copper alloy which comprises contacting the surface with a composition as in claim 1 in an amount and for a period of time sufficient to roughen the surface and provide improved adhesion of a layer subsequently applied thereto.

14. A method according to claim 13, wherein the subsequently applied layer is a resist or a prepreg.

15. In a method of making a printed circuit board wherein a copper or copper alloy is etched and bonded to a prepreg, the improvement which comprises using the composition of claim 1 to etch the surface of the copper or copper alloy.

* * * * *